United States Patent [19]

Patel et al.

[11] Patent Number: 5,371,422

[45] Date of Patent: Dec. 6, 1994

[54] PROGRAMMABLE LOGIC DEVICE HAVING MULTIPLEXERS AND DEMULTIPLEXERS RANDOMLY CONNECTED TO GLOBAL CONDUCTORS FOR INTERCONNECTIONS BETWEEN LOGIC ELEMENTS

[75] Inventors: Rakesh H. Patel, Santa Clara; John E. Turner, Santa Cruz; Myron W. Wong, San Jose, all of Calif.

[73] Assignee: Altera Corporation, San Jose, Calif.

[21] Appl. No.: 38,787

[22] Filed: Mar. 29, 1993

Related U.S. Application Data

[63] Continuation-in-part of Ser. No. 880,942, May 8, 1992, Pat. No. 5,260,611, which is a continuation-in-part of Ser. No. 754,017, Sep. 3, 1991, Pat. No. 5,260,610.

[51] Int. Cl.$^5$ .......................................... H03K 19/177
[52] U.S. Cl. ............................................ 326/41; 326/39
[58] Field of Search .................. 340/825.83; 307/243, 307/443, 465, 465.1

[56] References Cited

U.S. PATENT DOCUMENTS

| | | | |
|---|---|---|---|
| 3,473,160 | 10/1969 | Wahlstrom | 340/172.5 |
| 4,124,899 | 11/1978 | Birkner et al. | 364/716 |
| 4,398,267 | 8/1983 | Furuyama | 365/182 |
| 4,642,487 | 2/1987 | Carter | 307/465 |
| 4,644,191 | 2/1987 | Fisher et al. | 307/465 |
| 4,689,654 | 8/1987 | Brockmann | 357/45 |
| 4,706,216 | 11/1987 | Carter | 365/94 |
| 4,745,579 | 5/1988 | Mead et al. | 365/104 |
| 4,758,745 | 7/1988 | Elgamal et al. | 307/465 |
| 4,758,985 | 7/1988 | Carter | 365/94 |
| 4,786,904 | 11/1988 | Graham, III et al. | 340/825.83 |
| 4,847,612 | 7/1989 | Kaplinsky | 340/825.8 |
| 4,855,619 | 8/1989 | Hsieh et al. | 307/443 |
| 4,870,302 | 9/1989 | Freeman | 307/465 |
| 4,873,459 | 10/1989 | El Gamal et al. | 307/465 |
| 4,879,481 | 11/1989 | Pathak et al. | 307/465 |
| 4,912,345 | 3/1990 | Steele et al. | 307/465 |
| 4,937,475 | 6/1990 | Rhodes et al. | 307/465 |
| 4,963,768 | 10/1990 | Agrawal et al. | 307/465 |
| 5,015,884 | 5/1991 | Agrawal et al. | 307/465 |
| 5,027,011 | 6/1991 | Steele | 307/465 |
| 5,122,685 | 6/1992 | Chan et al. | 307/465.1 |
| 5,144,166 | 9/1992 | Camarota et al. | 307/465.1 |
| 5,243,283 | 9/1993 | Kean | 307/465 |
| 5,268,598 | 12/1993 | Pederson et al. | 307/465 |

FOREIGN PATENT DOCUMENTS 1444084  1/1976  United Kingdom ........ H03K 19/00

OTHER PUBLICATIONS

R. C. Minnick, "A Survey of Microcellular Research", Journal of the Association for Computing Machinery, vol. 14, No. 2, pp. 203-241, Apr. 1967.

S. E. Wahlstrom, "Programmable Logic Arrays—Cheaper by the Millions", Electronics, Dec. 11, 1967, pp 90-95.

Stephen S. Yau, "Universal Logic Modules and Their Applications", IEEE Transactions on Computers, vol. C-19, No. 2, Feb. 1970, pp. 141-149.

(List continued on next page.)

*Primary Examiner*—Edward P. Westin
*Assistant Examiner*—Benjamin D. Driscoll
*Attorney, Agent, or Firm*—Robert R. Jackson; G. Victor Treyz

[57] ABSTRACT

A programmable logic device is provided that has a two-dimensional array of logic array blocks. The logic array blocks, which contain advanced macrocells, contain programmable input arrays based on pterm logic and are two-dimensionally interconnected with global horizontal and vertical conductors. The logic array blocks and the connections between conductors are configured using programmable multiplexers and demultiplexers. Redundant conductive pathways are provided so that the programmable logic device may be efficiently programmed to perform a variety of logic functions. Furthermore, logic is provided with each logic array block that allows the global horizontal and vertical conductors to be interconnected without directly involving the logic in the logic array block, which therefore can be used to provide greater logical functionality.

32 Claims, 8 Drawing Sheets

OTHER PUBLICATIONS

Richard G. Shoup, Programmable Cellular Logic Arrays (1970) (Ph.D. dissertation, Carnegie-Mellon University (Pittsburgh).

Carr et al., *MOS/LSI Design and Application*, Texas Instruments Electronics Series, McGraw-Hill and Co., 1972, 229–258.

F. Heutink, "Implications of Busing for Cellular Arrays", Computer Design, pp. 95–100, Nov., 1974.

H. Fleisher et al., "An Introduction to Array Logic", IBM Journal of Research and Development, Mar. 1975, pp. 98–109.

K. Horniger, "A High-Speed ESFI SOS Programmable Logic Array with an MNOS Version", IEEE Journal of Solid State Circuits, vol. SC–10, No. 5, Oct. 1975, pp. 331–336.

B. Kitson et al., "Programmable Logic Chip Rivals Gate Arrays in Flexibility", Electronic Design, Dec. 8, 1983, pp. 95–105.

Advanced Micro Devices, "The World's Most Versatile Logic Tool; AmPAL22V10", May 1984.

Monolithic Memories, "Programmable Array Logic; PAL 20RA10", Jun. 1984.

*The Programmable Gate Array Data Book*, Xilinx, Inc., San Jose, Calif., 1988.

A. Haines, "Field-Programmable Gate Array with Non-Volatile Configuration", Microprocessors and Microsystems, vol. 13, No. 5, Jun. 1989, pp. 305–312.

K. A. El-Ayat et al., "A CMOS Electrically Configurable Gate Array", IEEE Journal of Solid State Circuits, vol. 24, No. 3, Jun. 1989, pp. 752–762.

F. Furtek et al., "Labyrinth: A Homogeneous Computational Medium", Proc. IEEE 1990 Custom Integrated Circuits Conference, pp. 31.1.1–31.1.4.

H-C. Hsieh et al., "Third-Generation Architecture Boosts Speed and Density of Field-Programmable Gate Arrays", Proc. IEEE 1990 Custom Integrated Circuits Conference, pp. 31.2.1–31.2.7.

M. Ahrens et al., "An FPGA Family Optimized for High Densities and Reduced Routing Delay", Proc. IEEE 1990 Custom Integrated Circuits Conference, pp. 31.5.1–31.5.4.

*The Programmable Gate Array Data Book*, Xilinx, Inc., San Jose, California, 1991, pp. 1–3 through 1–5, pp. 2–1 through 2–13, and 2–61 through 2–69.

AT&T ORCA Series Field-Programmable Gate Arrays, "Advance Product Information".

PROGRAMMABLE LOGIC DEVICE HAVING MULTIPLEXERS AND DEMULTIPLEXERS RANDOMLY CONNECTED TO GLOBAL CONDUCTORS FOR INTERCONNECTIONS BETWEEN LOGIC ELEMENTS

This application is a continuation-in-part of U.S. patent application Ser. No. 880,942, filed May 8, 1992, now U.S. Pat. No. 5,260,611 which is a continuation-in-part of U.S. patent application Ser. No. 754,017, filed Sep. 3, 1991 now U.S. Pat. No. 5,260,610.

BACKGROUND OF THE INVENTION

This invention relates to programmable logic devices, and more particularly to programmable logic devices having improved logic array blocks, and improved interconnections between macrocells within these blocks and between blocks.

Programmable logic devices are capable of being programmed to provide complex logic functions by interconnecting regions of logic of low to moderate sophistication. However, the most advanced logic can be difficult to interconnect because this involves programmably interconnecting a large number of logic terms. Unless sufficient routing resources are provided, the logic on the programmable logic device will be under-utilized. For instance, if too few conducting lines are provided or the interconnections are insufficiently flexible, all pathways between certain regions of logic may be blocked. Further, the schemes generally used for interconnecting the more basic types of logic cannot simply be scaled up to accommodate complex logic. Merely providing a larger number of conductors in substantially the same fashion as used for interconnecting rudimentary logic quickly becomes untenable with regard to circuit speed and chip "real estate."

Another consideration involves using logic that it is arranged in complex logic blocks that are based on multiple "macrocells" of logic. With this type of logic, if the macrocells themselves are sufficiently complex it becomes necessary to provide a more sophisticated macrocell interconnection scheme. Macrocells must work efficiently with the other macrocells within each logic block, which necessitates interconnections that can be flexibly routed to allow logic in each macrocell to be shared among other macrocells in the same logic block. Further, it would be advantageous if the outputs of the macrocells could be fed back as inputs to the other macrocells, as this allows relatively more complex logic functions to be provided by a single logic array block. Macrocell resources should also be available to be shared among distinct logic blocks so that logic designers are not unduly constrained by the specific number of macrocells within each block.

It is therefore an object of this invention to provide improved programmable logic devices.

It is a further object of this invention to provide improved programmable logic devices having improved programmable interconnections between improved logic array blocks that are based on advanced macrocells.

SUMMARY OF THE INVENTION

These and other objects of the invention are accomplished in accordance with the principles of the present invention by providing improved programmable logic device logic array blocks (LABs), which are configured in a two-dimensional array. In a preferred embodiment, rows of global horizontal conductors and columns of global vertical conductors provide the necessary interconnection pathways between input/output (I/O) pads and LABs. The two-dimensional array partitions the programmable logic device, which facilitated design implementation. The LABs in each row receive input signals from the horizontal conductors in that row. LAB resources can be shared within a row by directing the output signals of an LAB back onto the horizontal conductors, where this data may be provided as an input to another LAB. If desired (generally when the resources in a row are nearly exhausted), the LAB output signals may be directed to a vertical conductor and subsequently onto a horizontal conductor in another row. Further, direct connections between vertical and horizontal conductors can be made that bypass the LABs entirely, and therefore spare LABs from being used for this function.

Each LAB contains a group of macrocells that are interconnected by a logic array that is associated with that group. The logic array shields the inputs to the logic array block from propagation delays due to variable fan-out within the block. In a preferred embodiment, the macrocells that are used have the capability to route product terms from the logic array directly back as wordline inputs to the same array. The output of each macrocell can also be provided as an input to this array, which allows greater functionality to be obtained than would otherwise be possible. In addition to building logic functions from macrocells within an individual logic array block, it is also possible to use macrocells in other blocks by routing signals to and from these macrocells through the horizontal conductors.

To avoid blocking desired interconnection pathways, multiple pathways between I/O pads and LABs are provided. If a desired path is unavailable an alternate path can be used. Further, it has been determined that this interconnection scheme is particularly flexible and efficient if certain of the fixed connections to the global horizontal and global vertical lines are made randomly. Further features of the invention, its nature and various advantages will be more apparent from the following detailed description of the preferred embodiments and the accompanying drawings.

DETAILED DESCRIPTION OF THE PREFERRED EMBODIMENTS

Programmable logic devices (PLDs) represent a class of integrated circuits that can be programmed by a logic designer to execute any of a variety of logic functions. Relatively simple logic elements are connected by a pattern of fixed and programmable interconnections. PLD performance is closely related to both the sophistication of the individual logic element building blocks that are used, and the capacity to flexibly interconnect this logic. These two resources must be balanced appropriately so that the PLD is capable of being programmed to perform the logic functions that are required without becoming excessively costly or becoming too slow during operation. For some device applications it is advantageous to use complex logic elements that can accept a large number of input logic terms. In order to interconnect this logic successfully, it is important that the PLD interconnection pathways be sufficiently flexible so that none are blocked when making other connections.

Figure 1:
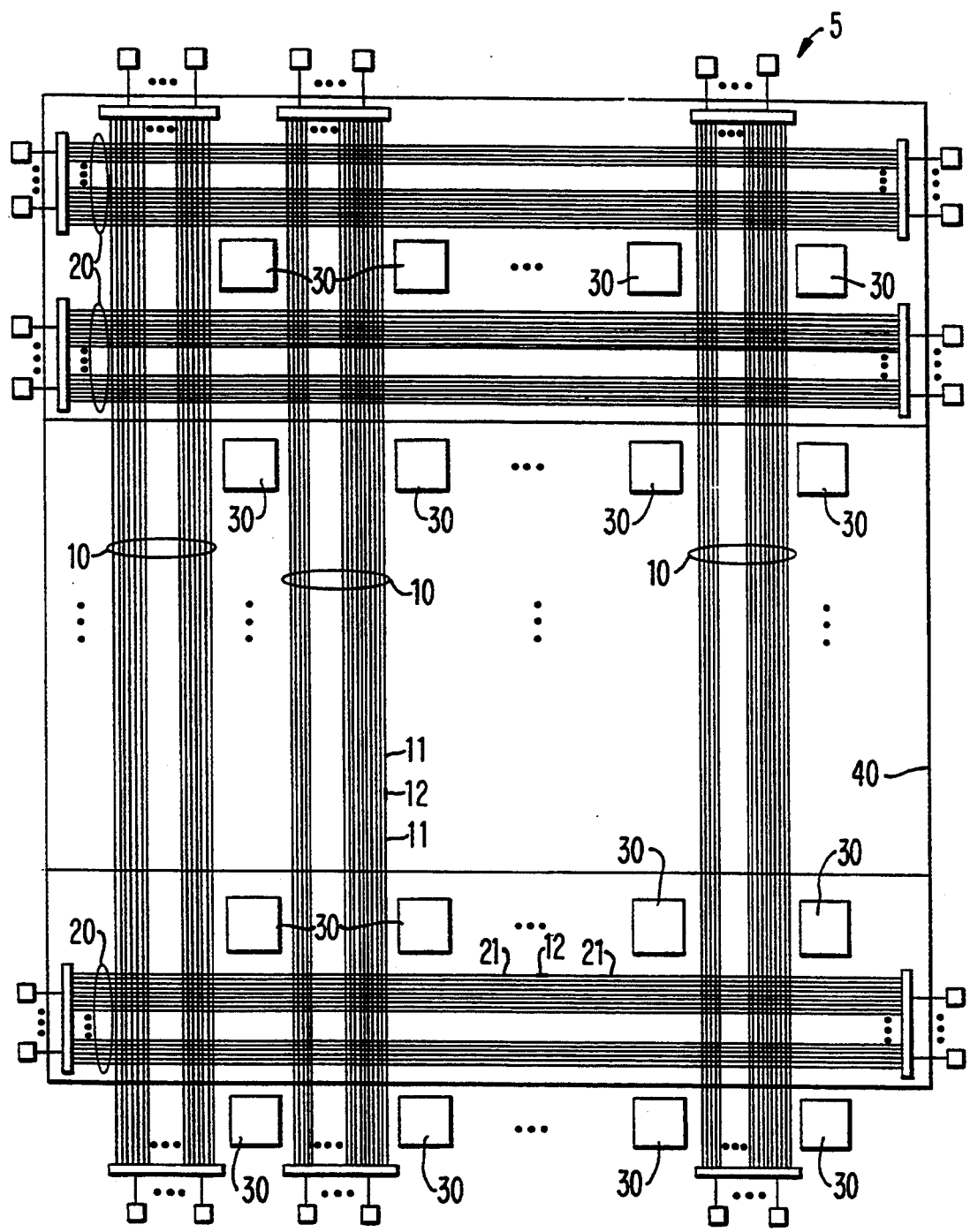
FIG. 1 is a simplified schematic block diagram of an illustrative embodiment of a programmable logic device constructed in accordance with the invention.

In accordance with the present invention, a programmable logic device is provided that has improved macrocells interconnected to form improved logic array blocks (LABs). The device has a flexible interconnection scheme which provides redundant conductive pathways. Some fixed connections between conductors are made in a random pattern so that wiring resources may be used efficiently. The general layout of an illustrative embodiment of PLD 5 is shown in FIG. 1. Multiple global vertical conductors 10 and global horizontal conductors 20 are grouped in columns and rows, respectively. LABs 30 are provided in an array having a corresponding number of rows and columns. In a preferred embodiment, PLD 5 has 11 rows, each having 168 global horizontal conductors 20, and seven columns, each having 48 global vertical conductors 10. Global lines 40, which are discussed further below, are connected to input pads for receiving CLOCK, CLEAR, and OUTPUT ENABLE (OE) signals and for providing these signals to LABS 30 and input/output logic of PLD 5.

Figure 2:
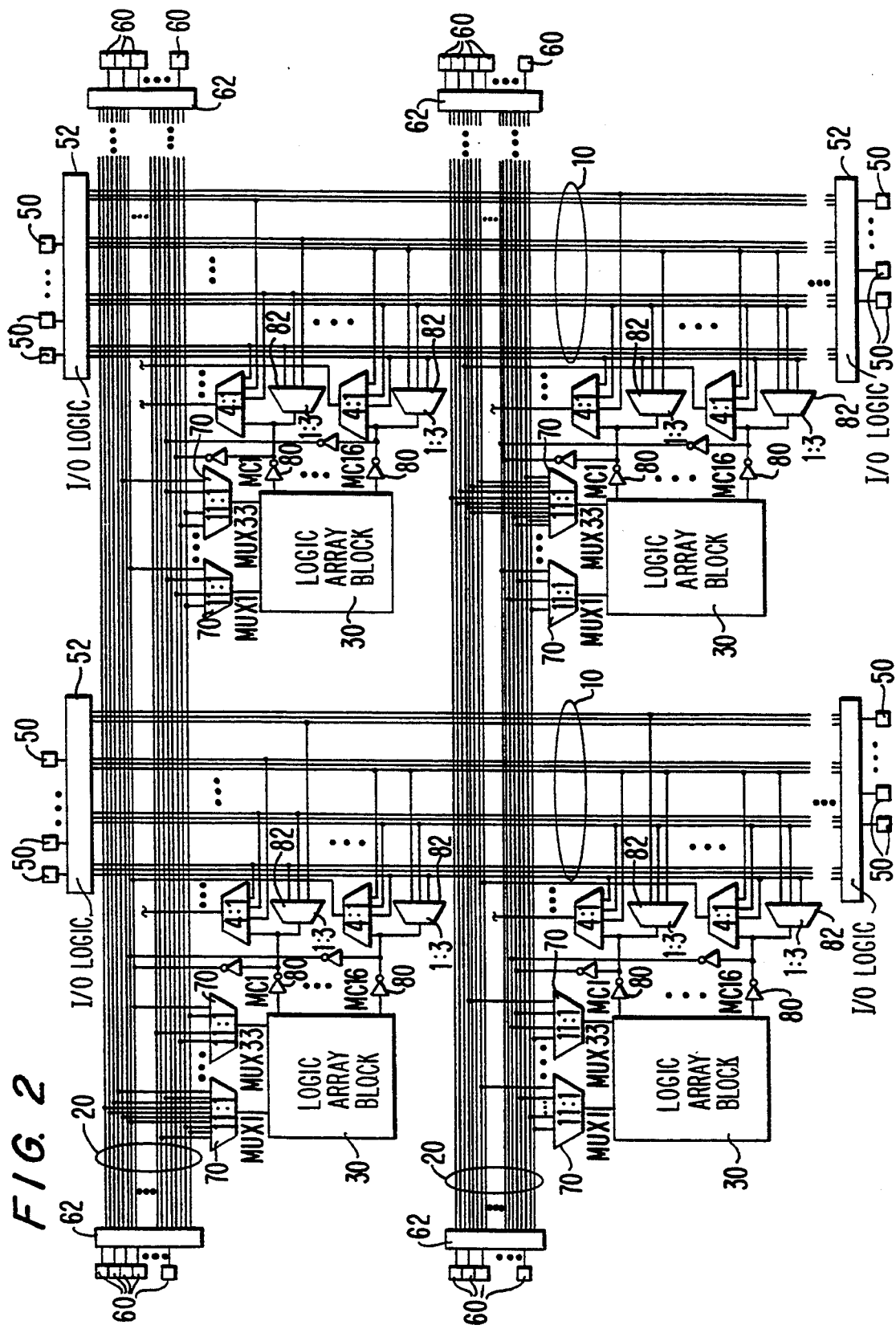
FIG. 2 is a more detailed schematic block diagram of a portion of the illustrative programmable logic device of FIG. 1.
Figure 3:
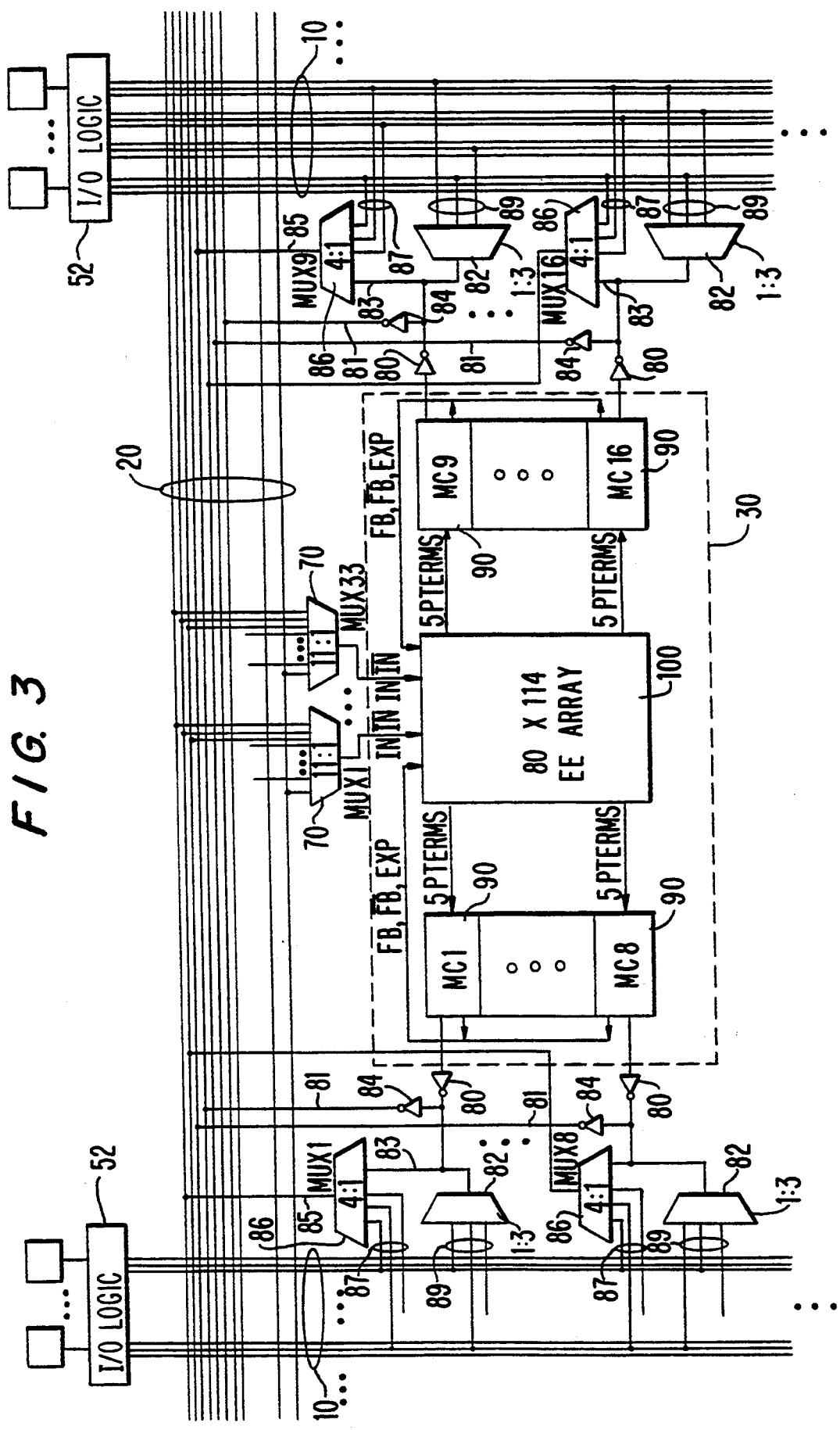
FIG. 3 is a schematic block diagram of an illustrative logic array block constructed in accordance with the present invention, which shows connections to global horizontal and global vertical lines.

The input to each LAB 30 is made through 11:1 multiplexers 70, as shown in FIG. 2. The 11:1 multiplexers 70 are connected to global horizontal conductors 20. Each LAB 30 preferably contains 16 macrocells 90, as shown in FIG. 3. Although not shown for all of macrocells 90, each macrocell 90 is connected to a corresponding macrocell output driver 80, 1:3 demultiplexer 82 (interconnection demultiplexer), tristate output buffer 84, and 4:1 multiplexer 86 (interconnection multiplexer). Each 4:1 multiplexer 86 has three 4:1 multiplexer inputs 87 and a 4:1 multiplexer input 83. The logic of PLD 5 is programmable so that PLD 5 can be configured to perform a variety of logic functions. In a preferred embodiment, the programming logic is based on electrically-programmable erasable programmable read-only memory ($E^2PROM$) transistors, although one skilled in the art will appreciate that other types of programmable logic may be used as well. For instance, programmable cells based on static random-access memory (SRAM) or programmable fuses or antifuses may be used.

As shown in FIG. 3, macrocells are interconnected within each LAB 30 by logic array 100. Logic array 100 is typically a programmable NOR array for producing product term ("pterm") output signals, each of which is the logical NOR of any desired group of the inputs to array 100. Although logic array 100 is a NOR array, a system designer can effectively convert the array into an AND array by entering the array via the appropriate complementary wordlines. For this reason, logic array 100 can also be considered to be an AND array. One advantage of using logic array 100 to route the inputs to the macrocells is that the propagation delay associated with passing through the array is fixed. This delay is independent of the number of macrocells selected to be connected to each input line because the input is connected to a fixed number of $E^2PROM$ transistor gate terminals. The delay due to the relatively small parasitic capacitance on the gate terminals is independent of whether or not the transistor is programmed or erased.

The macrocell outputs of each LAB 30 are connected to global horizontal conductors 20, where these outputs become available as inputs to other LABs. Each macrocell 90 can be connected to a global horizontal conductor 20 with either 4:1 multiplexer 86 or tristate output buffer 84. When it is desired to connect the logic of one row to another, the output signals of an appropriate macrocell 90 in the first row can be connected to a global vertical conductor 10 with 1:3 demultiplexer 82. The signals are then provided to the global horizontal conductors 20 of the second row with the 4:1 multiplexer 86 in the second row that is connected to the same global vertical conductor 10. One advantage of the PLD of the present invention is that the connections between vertical and horizontal conductors can be made using multiplexers without using LAB resources.

Often a logic designer will find it desirable to place several custom circuit designs on a single PLD 5. In this case, it may be advantageous to implement the circuit using LABs 30 in the first row of PLD 5, interconnected by the corresponding horizontal conductors in that row. Global vertical conductors 10 may then be used to couple the outputs of the first row onto the horizontal conductors in the second row. Because of the architecture of PLD 5, a circuit designer can more easily modularize a logic design. Of course, if it is desired to implement a relatively large logic design on PLD 5, all rows of PLD 5 can be used. Further, horizontal conductors in separate rows can be simultaneously coupled to a single global vertical conductor 10 with 4:1 multiplexers 86.

Although it is advantageous to provide vertical and horizontal conductors which span the entire PLD array, it is also possible to obtain benefits by breaking up the conductors into shorter subsegments, because this reduces capacitive loading. It would therefore be desirable to provide horizontal subsegments for linking adjacent LABs within a row. Vertical conductive subsegments can also be used to link logic in adjacent rows, although global vertical conductors would continue to be useful for providing direct connections to the outputs of the circuit. To allow for greater design flexibility, programmable interconnections can be provided so that the subsegments can be selectively linked using, for instance, antifuse technology. The Programmable interconnection of vertical conductive subsegments 11 and horizontal conductive subsegments 21 with programmable links 12 is shown in FIG. 1.

In order to maintain a highly flexible set of interconnections, the 48 4:1 multiplexer inputs 87 associated with each LAB 30 are connected in a mutually exclusive pattern to the 48 global vertical conductors 10 and the outputs 85 of the 4:1 multiplexers 87 are connected in a mutually exclusive pattern to the global horizontal conductors 20. Similarly, the 48 1:3 demultiplexer outputs 89 per LAB 30 are also connected in a mutually exclusive pattern. The 16 tristate output buffer outputs 81 per LAB 30 are connected to mutually exclusive global horizontal conductors 20.

All multiplexers shown in PLD 5 are preferably controlled by user-configurable programmable elements, so that, for instance, the output of each macrocell 90 can be selectively applied by 1:3 demultiplexer 82 to one, two, or three of the global vertical conductors 10 to which 1:3 demultiplexer outputs 89 are connected. Similarly, each 4:1 multiplexer 86 can be programmed so that the output of macrocell 90 is simultaneously or separately applied to one of global horizontal conductors 20. If this connection is made, 4:1 demultiplexer inputs 87 must be isolated to avoid contention. Further, a connection to one of the global horizontal conductors 20 via 4:1 multiplexer input 83 is preferable to one made using the path involving 1:3 demultiplexer 82, one of 1:3 demultiplexer outputs 89, one of global vertical conductors 10, and one of 4:1 multiplexer inputs 87, due to the added delay present with the longer route. Similarly, to connect one of global vertical conductors 10 to one of global horizontal conductors 20, 4:1 multiplexer 86 is used, since this is the most direct connection.

In order to insure that interconnection pathways are blocked as infrequently as possible, many connections between conductors are made in a random pattern, as this has been statistically shown to be less likely to lead to a blocked path than an ordered set of connections. For instance, the fixed connections between the global horizontal lines 20 and the inputs of the 11:1 multiplexers 70 are made randomly. Each LAB 30 has 33 11:1 multiplexers 70 (logic array block input multiplexers), which are connected randomly to the 168 global horizontal conductors 20. Each global horizontal conductor 20 is connected twice to the 11:1 multiplexers 70 in a LAB 30, although the two connections must be made to separate 11:1 multiplexers. Other connections to the global horizontal conductors 20 are also made in a random pattern. For example, since there are seven LABs 30 per row, there are 112 corresponding tristate output buffer outputs 81 in each row. These are connected randomly to 56 of the 168 global horizontal conductors 20, with the restriction that no two tristate output buffer outputs 81 from the same LAB 30 are connected to the same global horizontal conductor 20. Each of the remaining 112 global horizontal lines is connected to one of the 112 4:1 multiplexer outputs 85 per row.

Figure 4:
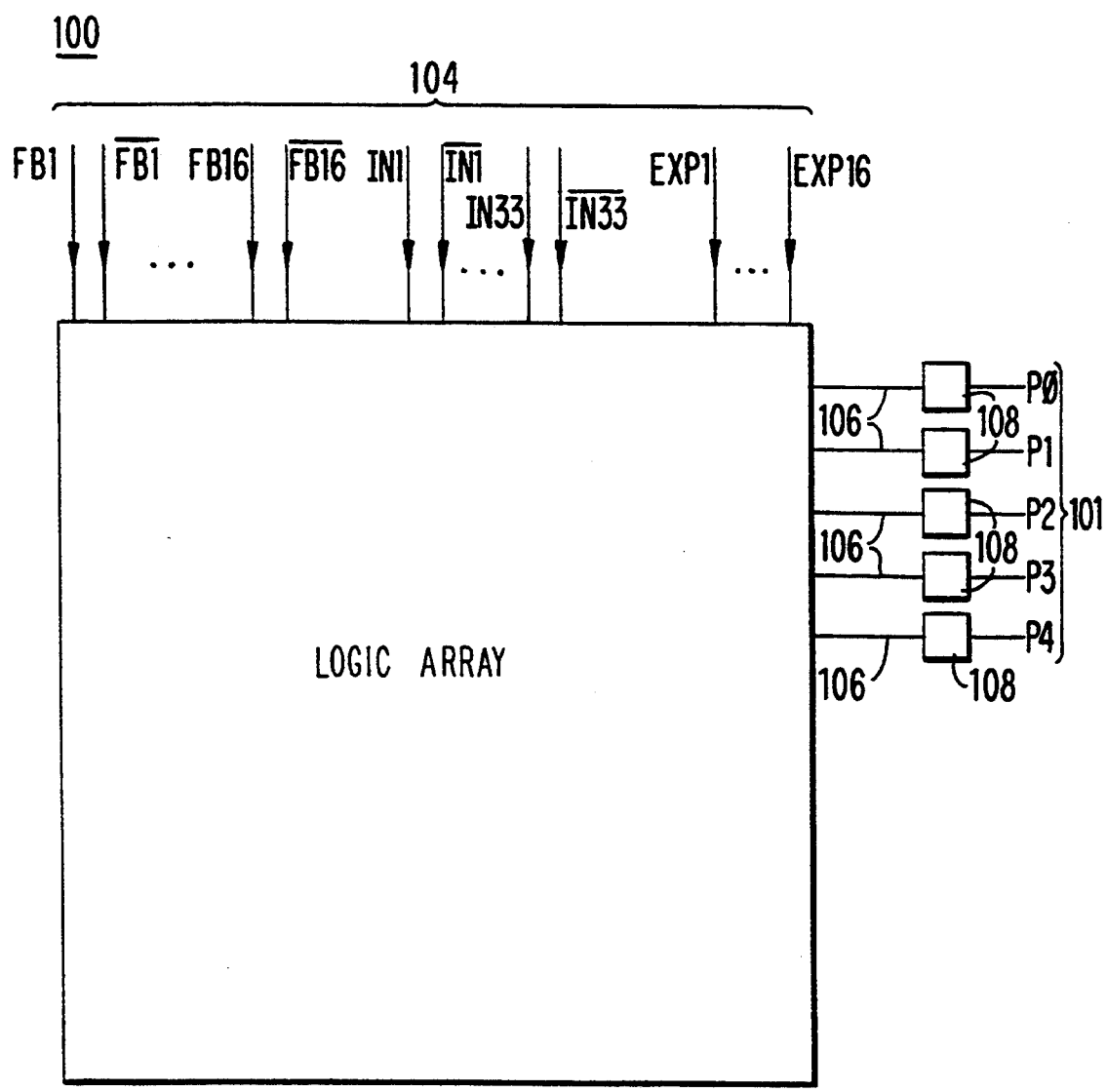
FIG. 4 is a schematic block diagram of an illustrative embodiment of a programmable array suitable for use in the logic array blocks of a programmable logic device constructed in accordance with the invention.

The random connections between global horizontal conductors 20 and the inputs and outputs of each LAB 30 in a row facilitate building logic functions in that row. Within each LAB 30, the inputs from the global horizontal conductors 20 are programmably interconnected with macrocells 90 by logic array 100. As shown in FIG. 4, the 33 inputs (INs) and their complements ($\overline{INs}$), which are the outputs of the 33 11:1 multiplexers 70, make up 66 of the 114 word lines (columns) of logic array 100. The additional word lines consist of 16 feedback (FB) signals, their 16 complements ($\overline{FBs}$), and 16 expansion signals (EXPs), each from one of the 16 macrocells 90 per LAB 30.

Figure 5:
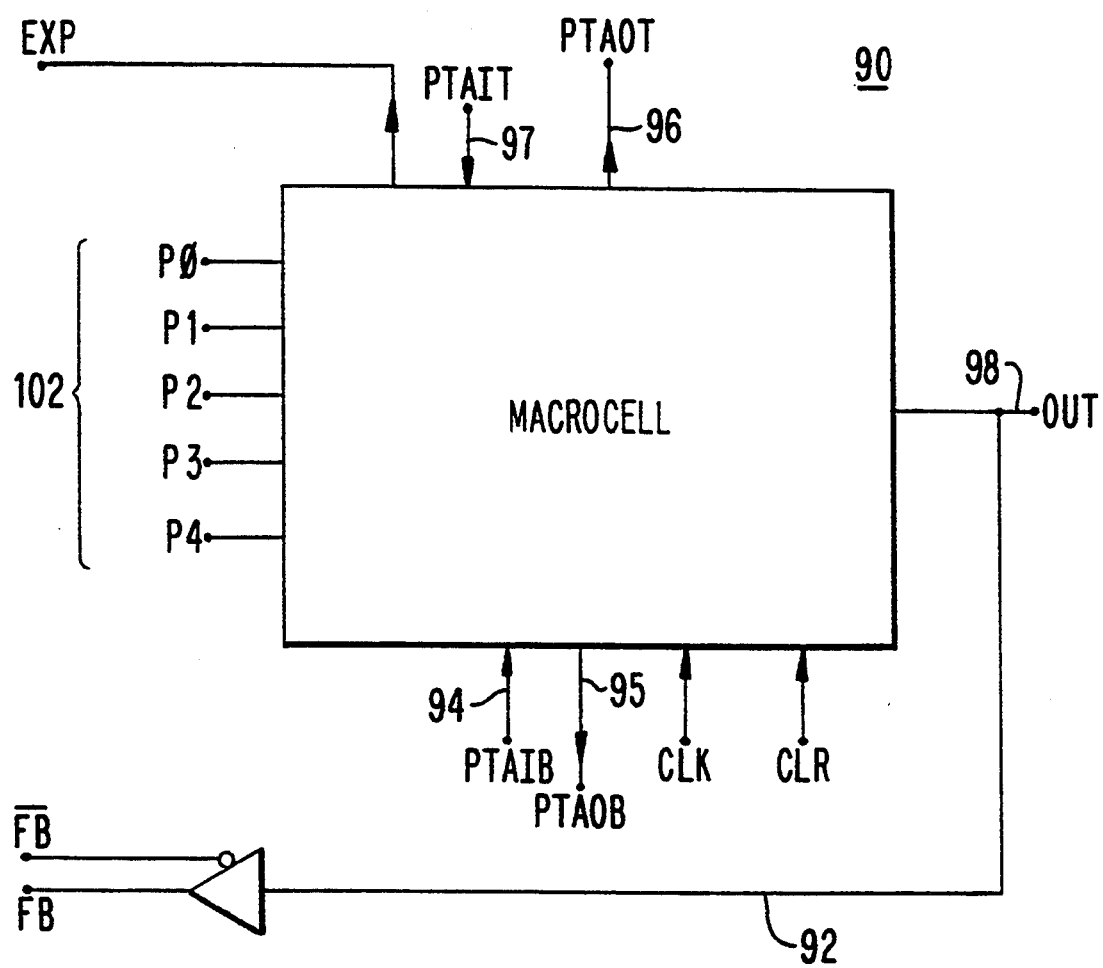
FIG. 5 is a simplified schematic block diagram of an illustrative embodiment of a macrocell that is suitable for use in the logic array blocks of a programmable logic device constructed in accordance with the invention.

Although any suitable macrocell 90 can be used in PLD 5, in a preferred embodiment macrocell 90 has the functionality of the type of macrocell shown in commonly-assigned Pedersen U.S. Pat. No. 5,121,006, which is incorporated herein by reference. As shown in FIG. 5, such a macrocell can be provided with feedback connection 92 to logic array 100 to provide the FB signals as inputs to the array. Macrocell 90 receives signals from logic array 100 via logic array outputs 101 (shown in FIG. 4). Clock (CLK) and clear (CLR) signals are received from global lines 40. Macrocells 90 can be further improved so that within a LAB 30, macrocells 90 can be interconnected using PTAIB input 94, PTAOB output 95, PTAOT output 96, and PTAIT input 97. These inputs and outputs can be used to daisy-chain macrocells 90, either by connecting PTAOT outputs 96 to PTAIB inputs 94 or by connecting PTAOB outputs 95 to PTAIT inputs 97. There is a finite delay associated with the interconnection of each macrocell in a daisy-chain. Therefore, if 16 macrocells are linked together the system will exhibit a delay equal to the sum of the delays attributable to each of the 16 cells. This delay can be reduced substantially by linking approximately one half of the macrocells to a central macrocell using PTAOT outputs 96 and PTAIB inputs 94. The other half of the macrocells can be linked to the same central macrocell using PTAOB outputs 95 and PTAIT inputs 97. Because the longest path in this arrangement is approximately one half of the previous total path length, the delay associated with this arrangement is also cut in half.

Each macrocell output terminal 98 is connected to one of macrocell output drivers 80. As described above, each macrocell 90 preferably provides an expansion signal (EXP) to a wordline of array 100. An expansion signal capability allows at least one of macrocell inputs 102 to be switched directly back into array 100.

Although various macrocell designs can be used that have inputs and outputs different from those of the preferred illustrative embodiment shown in FIG. 5, macrocell 90 must include the appropriate logic to implement a sum of products with logic array 100. For instance, in the illustrative embodiment of logic array 100 shown in FIG. 4, wordlines 104 are connected to horizontal lines 106 with $E^2$PROM transistors, providing the logical NOR of wordlines 104 to inverting sense amplifiers 108. By entering the array through the appropriate complementary word lines, the resulting outputs become the logical AND of the inputs, and are therefore called product terms ("pterms") because an AND function output is the logical product of its inputs. It will be appreciated that although five logic array outputs 101 are shown in FIG. 4, these are just the outputs to one of the 16 macrocells 90 per LAB 30. The remaining 75 pterm outputs in each LAB are connected to macrocells 90 as shown in FIG. 3.

To fully implement any arbitrary combinational logic design, a complete "sum of products" must be provided, for instance, in a preferred embodiment, the pterms are logically summed by an OR gate in macrocell 90. However, it will be apparent to one skilled in the art that a sum of products may be formed not only by using AND-OR logic, but by using any equivalent two-level logic configuration, such as NAND-NAND, NOR-OR, OR-NAND, AND-NOR, NOR-NOR, NAND-AND, or OR-AND. By using pterm logic in a two-dimensional array of LABs 30, a large number of independent logic terms (80 in the present embodiment) may be used to drive the 16 macrocells 90 per LAB 30. To achieve a desired logic function, array 100 is programmed by the logic designer, as are the various multiplexers of PLD 5.

Figure 6:
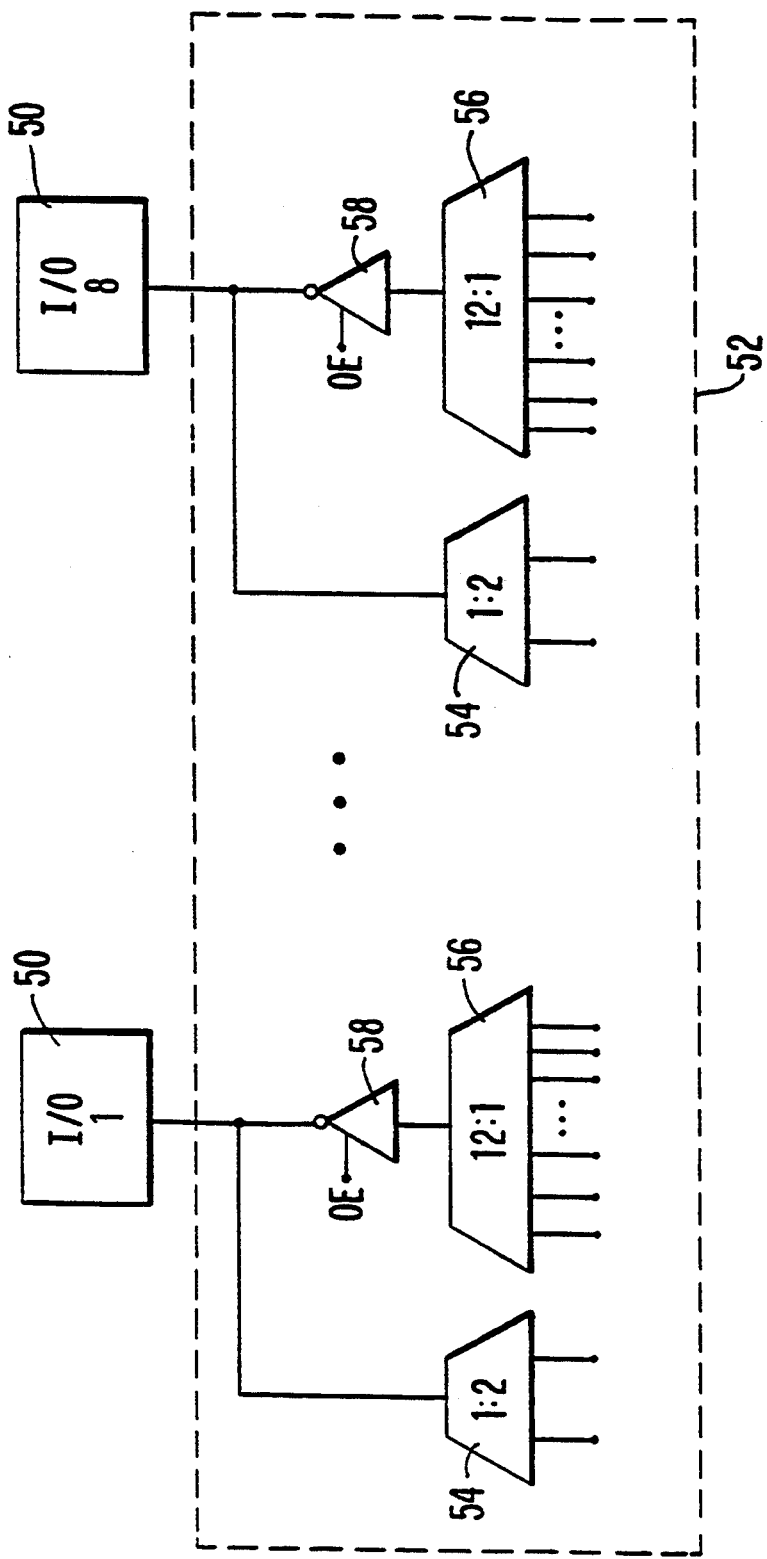
FIG. 6 is a schematic block diagram of an illustrative embodiment of input/output logic for the global vertical lines of a programmable logic device constructed in accordance with the invention.
Figure 7:
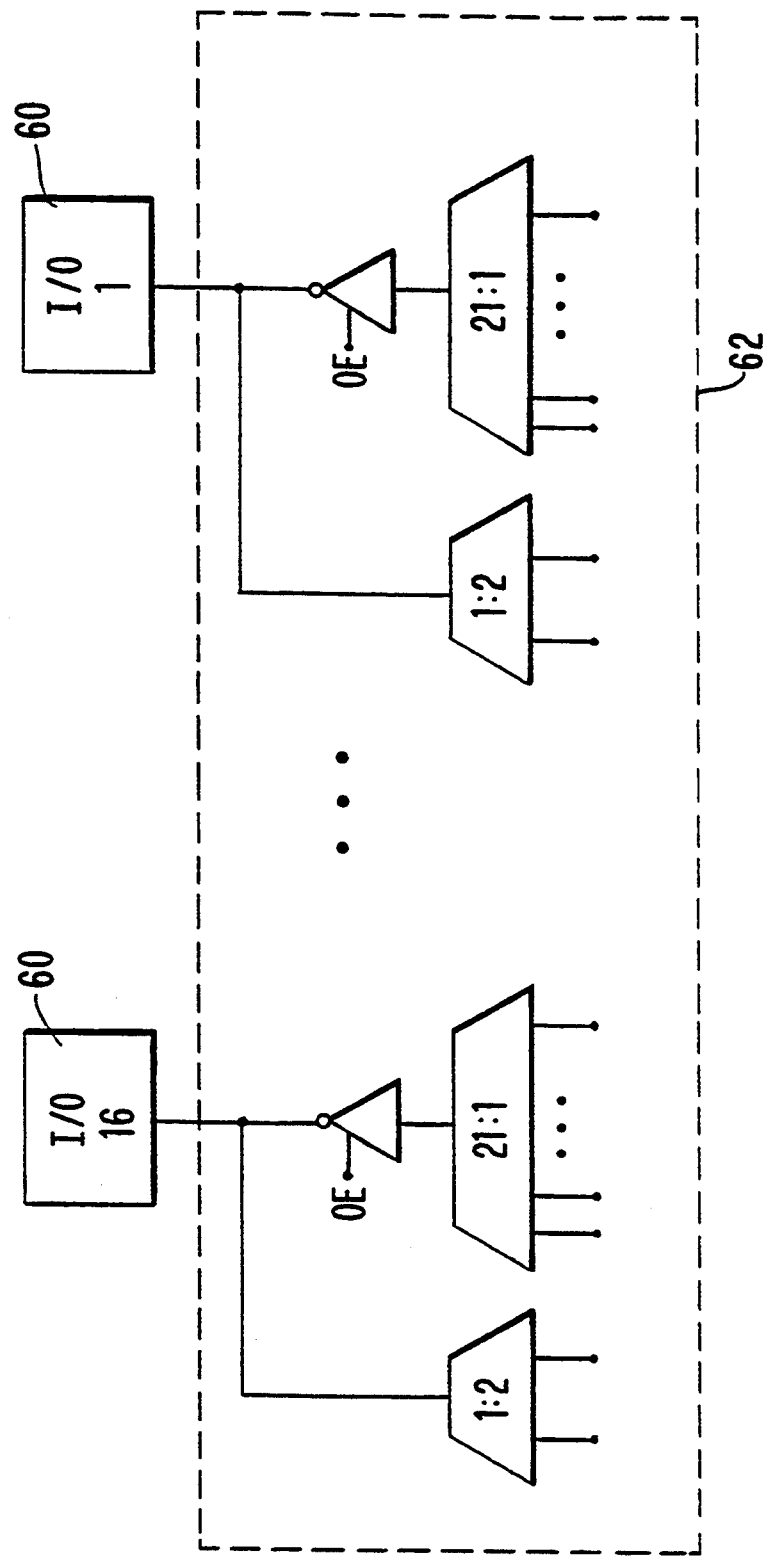
FIG. 7 is a schematic block diagram of an illustrative embodiment of input/output logic for the global horizontal lines of a programmable logic device constructed in accordance with the invention.

The inputs to PLD 5 and the PLD outputs are made via I/O pads 50 and 60. As shown in FIGS. 6 and 7, I/O logic 52 (vertical input demultiplexers and output multiplexers) and I/O logic 62 (horizontal input demultiplexers and output multiplexers) is used to connect the I/O pads to the global vertical and horizontal conductors. In the vertical dimension there are eight I/O pads 50 per column each having a corresponding 1:2 demultiplexer 54 and a 12:1 multiplexer 56. If an I/O pad 50 is configured as an input pad, 1:2 demultiplexer 54 is enabled and 12:1 multiplexer 56 is disabled. The 16 outputs of the eight demultiplexers 54 per vertical column are connected in a mutually exclusive pattern to 16 of the 48 global vertical conductors 10. If an I/O pad 50 is configured as an output pad, 1:2 demultiplexer 54 is disabled and 12:1 multiplexer 56 is enabled. As with the horizontal and vertical connections to LABs 30, each of the 96 inputs of the eight 12:1 multiplexers 56 per vertical column are connected to the 48 global vertical conductors 10 per column in a random pattern. Each of the 48 global vertical conducts 10 is connected to two of the 12:1 multiplexers 56 in the column.

I/O logic 52 further includes tristate output buffers 58, which are enabled by the output enable (OE) signal from global lines 40. The function of I/O logic 62 is identical to that of I/O logic 52, with the exception that 21:1 multiplexers are used so that each of the 168 global horizontal conductors 20 per row can be connected twice to the 336 inputs of the 16 21:1 multiplexers per row.

Figure 8:
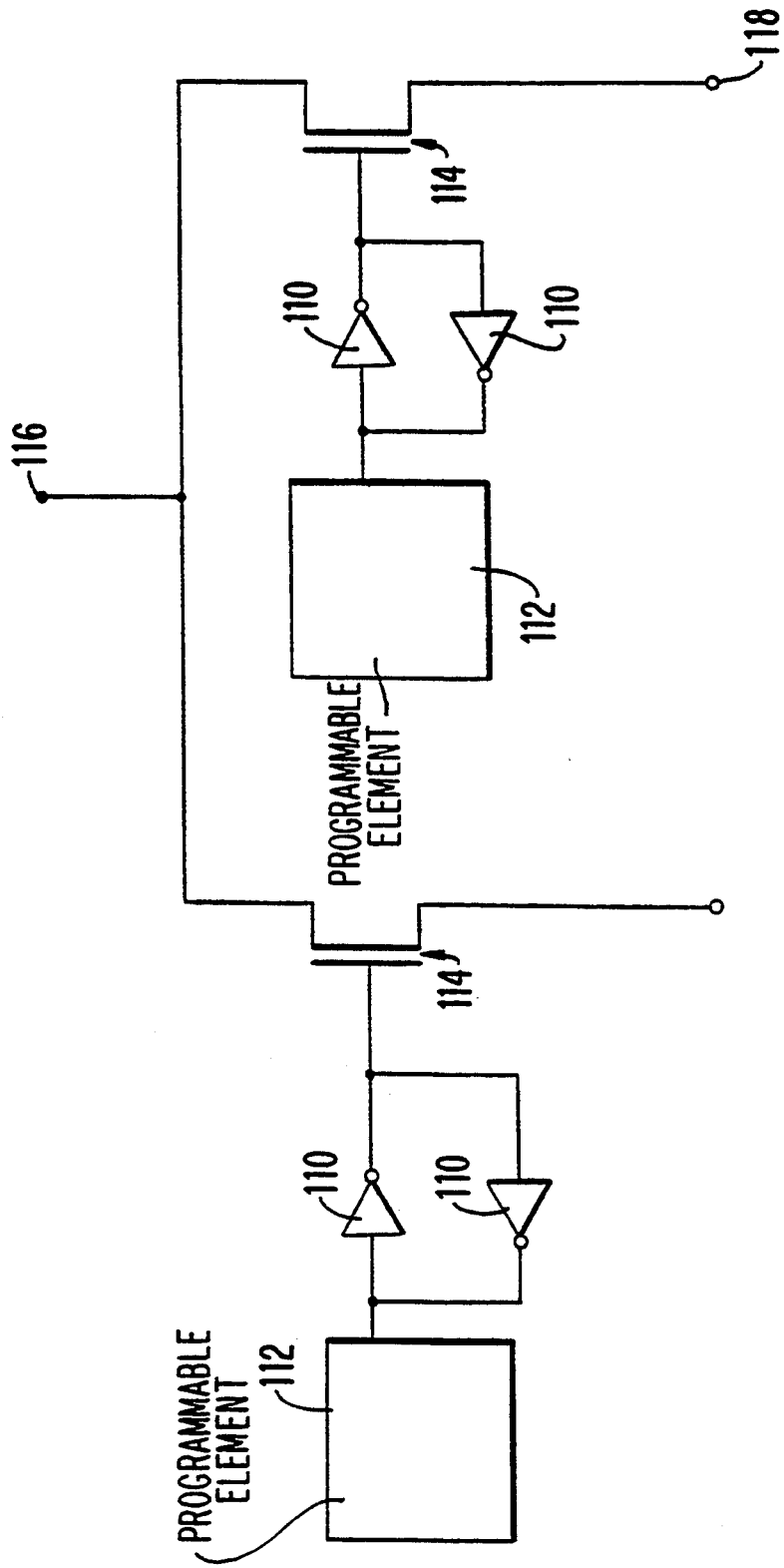
FIG. 8 is a schematic block diagram of an illustrative embodiment of a demultiplexer constructed in accordance with the invention.

Although the multiplexers and the arrays of PLD 5 can be implemented in various programmable technologies, in a preferred embodiment, logic based on E2-PROM transistors is used so that the PLD programming is non-volatile. FIG. 8 shows an illustrative 1:2 demultiplexer (or multiplexer) constructed in accordance with the invention. Cross-coupled inverters 110 form a bistable connection between $E^2$PROM-transistor-based programmable element 112 and transistors 114. In operation, if it is desired to disable the demultiplexer (or multiplexer), both programmable elements 112 are programmed to supply a high output voltage, which causes the cross-coupled inverter circuit to apply a low potential to the gate of transistors 114, turning them off. If it is desired to make a connection across a transistor 114, programmable element 112 is programmed to provide a low output voltage, which causes the cross-coupled inverter circuit to supply a high voltage to transistor 114, turning it on and therefore allowing signals to pass freely between node 116 and, for example, node 118. (Alternatively, transistors could be used that turn off in the presence of a high voltage and turn on when a low voltage is applied).

Although a particular illustrative embodiment of PLD 5 has been described, PLD 5 can also be constructed with a different number of rows and columns and with a correspondingly different number of conductors and multiplexers. The type of programmable element used could also be changed and more than one type of element could be used within the same device. Additionally, the number of multiplexers and the size of the pterm array can be different. As mentioned above, various macrocells can be used in LAB 30, for instance, it is not essential that the macrocell have the same inputs and outputs shown in FIG. 5. The macrocell could be either more or less complex, depending on the desired range of logic functions to be provided and the size of PLD 5. Further, the number of macrocells per LAB can be varied. It will therefore be understood that the foregoing is merely illustrative of the principles of this invention and that various modifications can be made by those skilled in the art without departing from the scope and spirit of the invention.

What is claimed is:

1. A programmable logic device comprising:
    a plurality of logic array blocks arranged in a two-dimensional array, each logic array block containing a programmable array and a plurality of macrocells connected to the programmable array;
    a plurality of rows each containing a plurality of global horizontal conductors;
    a plurality of columns each containing a plurality of global vertical conductors, each row intersecting each column at an intersection, wherein one of the logic array blocks is disposed adjacent to one of the rows and one of the columns at each intersection;
    a plurality of horizontal I/O pads connected to each of the rows;
    a plurality of vertical I/O pads connected to each of the columns;
    input means connected to each logic array block for programmably connecting at least some of the global horizontal conductors in each row to logic array blocks adjacent to that row without using any of the global vertical conductors, so that the logic array blocks receive input signals from the global horizontal conductors;
    first output means connected to each logic array block for programmably connecting logic array blocks adjacent to each row to at least some of the global horizontal conductors in that row without using any of the global vertical conductors, so that the logic array blocks provide output signals to the global horizontal conductors in the adjacent row; and
    second output means connected to each logic array block for connecting the logic array blocks adjacent to each column to at least some of the global vertical conductors in that column without using any of the global horizontal conductors, so that the logic array blocks provide output signals to the global vertical conductors in the adjacent column.

2. The programmable logic device defined in claim 1 comprising:
    a plurality of interconnection demultiplexers, each of which has an input that is connected to a respective macrocell, each interconnection demultiplexer further having outputs that are connected to a mutually exclusive subplurality of the global vertical conductors in an adjacent column, each such connection between the interconnection demultiplexers and the adjacent column of global vertical conductors being mutually exclusive, each interconnection demultiplexer further being programmable so that the macrocell can be electrically connected to any of the global vertical conductors in the mutually exclusive subplurality; and
    a plurality of interconnection multiplexers, each of which has an input that is connected to a respective macrocell, each interconnection multiplexer further having inputs that are connected to a mutually exclusive subplurality of the global vertical conductors in an adjacent column, each interconnection multiplexer having an interconnection multiplexer output that is connected to one of the global horizontal conductors in an adjacent row, each interconnection multiplexer further being programmable so that one of the interconnection multiplexer inputs can be electrically connected to the interconnection multiplexer output.

3. The programmable logic device defined in claim 2 comprising a plurality of tristate buffers each of which has an input connected to a respective macrocell, each tristate buffer having an output that is connected to a global vertical conductor.

4. The programmable logic device defined in claim 1 wherein the programmable logic array is an AND array.

5. The programmable logic device defined in claim 1 wherein the output of each of the macrocells is fed back into the programmable array.

6. A programmable logic device comprising:
a plurality of logic array blocks arranged in a two-dimensional array, each logic array block containing a programmable array and a plurality of macrocells connected to the programmable array;
a plurality of rows each containing a plurality of global horizontal conductors;
a plurality of columns each containing a plurality of global vertical conductors, each row intersecting each column at an intersection, wherein one of the logic array blocks is disposed adjacent to one of the rows and one of the columns at each intersection;
a plurality of horizontal I/O pads;
a plurality of vertical I/O pads;
horizontal I/O means for programmably connecting at least some of the global horizontal conductors in each row to at least one of the horizontal I/O pads;
vertical I/O means for programmably connecting at least some of the global vertical conductors in each column to at least one of the vertical I/O pads;
horizontal multiplexer means connected to each logic array block for programmably connecting the programmable array of a logic array block to at least some of the global horizontal conductors in the row adjacent to the logic array block; and
vertical multiplexer means connected to each logic array block for programmably connecting the macrocells of a logic array block to at least some of the global vertical conductors in the column adjacent to that logic array block, the vertical multiplexer means further providing programmable connections between at least some of the global vertical conductors in that column and a subplurality of the global horizontal conductors in the row adjacent to the same logic array block, wherein the vertical I/O means comprises a plurality of programmable vertical output multiplexers connected to each column, each having an output connected to a respective I/O pad, the inputs of the vertical output multiplexer being connected to the global vertical conductors in the column to which the vertical output multiplexers are connected, each of the global vertical conductors having at least two connections to the plurality of vertical output multiplexers in the column to which the vertical output multiplexers are connected, the connections between each of the global vertical conductors and the vertical output multiplexers in that column otherwise being made in a random pattern, each of the vertical output multiplexers being programmable to electrically connect one of the connected global vertical conductors to the connected I/O pad.

7. The programmable logic device defined in claim 6 further comprising a plurality of programmable vertical input demultiplexers connected to each column, each having an input connected to a respective I/O pad, the outputs of each vertical input demultiplexer being connected to a mutually exclusive subplurality of the global vertical conductors in the column to which the vertical I/O means is connected, each of the vertical input demultiplexers being programmable to electrically connect one of the connected global vertical conductors to the connected I/O pad.

8. A programmable logic device comprising:
a plurality of logic array blocks arranged in a two-dimensional array, each logic array block containing a programmable array and a plurality of macrocells connected to the programmable array;
a plurality of rows each containing a plurality of global horizontal conductors;
a plurality of columns each containing a plurality of global vertical conductors, each row intersecting each column at an intersection, wherein one of the logic array blocks is disposed adjacent to one of the rows and one of the columns at each intersection;
a plurality of horizontal I/O pads;
a plurality of vertical I/O pads;
horizontal I/O means for programmably connecting at least some of the global horizontal conductors in each row to at least one of the horizontal I/O pads;
vertical I/O means for programmably connecting at least some of the global vertical conductors in each column to at least one of the vertical I/O pads;
horizontal multiplexer means connected to each logic array block for programmably connecting the programmable array of a logic array block to at least some of the global horizontal conductors in the row adjacent to the logic array block; and
vertical multiplexer means connected to each logic array block for programmably connecting the macrocells of a logic array block to at least some of the global vertical conductors in the column adjacent to that logic array block, the vertical multiplexer means further providing programmable connections between at least some of the global vertical conductors in that column and a subplurality of the global horizontal conductors in the row adjacent to the same logic array block, wherein the horizontal I/O means comprises a plurality of programmable horizontal output multiplexers connected to each row, each having an output connected to a respective I/O pad, the inputs of the horizontal output multiplexer being connected to the global horizontal conductors in the row to which the horizontal output multiplexers are connected, each of the global horizontal conductors having at least two connections to the plurality of horizontal output multiplexers in the row, the connections between each of the global horizontal conductors and the horizontal output multiplexers in the row otherwise being made in a random pattern, each of the horizontal output multiplexers being programmable to electrically connect one of the connected global horizontal conductors to the connected I/O pad.

9. The programmable logic device defined in claim 8 further comprising a plurality of programmable horizontal input demultiplexers connected to each row, each having an input connected to a respective I/O pad, the outputs of each horizontal input demultiplexer being connected to a mutually exclusive subplurality of the global horizontal conductors in the row to which the horizontal input demultiplexers are connected, each of the horizontal input demultiplexers being programmable to electrically connect one of the connected global horizontal conductors to the connected I/O pad.

10. A programmable logic device comprising:
a plurality of logic array blocks arranged in a two-dimensional array, each logic array block containing a programmable array and a plurality of macrocells connected to the programmable array;
a plurality of rows each containing a plurality of global horizontal conductors;
a plurality of columns each containing a plurality of global vertical conductors, each row intersecting each column at an intersection, wherein one of the logic array blocks is disposed adjacent to one of the rows and one of the columns at each intersection;
a plurality of horizontal I/O pads;
a plurality of vertical I/O pads;
horizontal I/O means for programmably connecting at least some of the global horizontal conductors in each row to at least one of the horizontal I/O pads;
vertical I/O means for programmably connecting at least some of the global vertical conductors in each column to at least one of the vertical I/O pads;
horizontal multiplexer means connected to each logic array block for programmably connecting the programmable array of a logic array block to at least some of the global horizontal conductors in the row adjacent to the logic array block; and
vertical multiplexer means connected to each logic array block for programmably connecting the macrocells of a logic array block to at least some of the global vertical conductors in the column adjacent to that logic array block, the vertical multiplexer means further providing programmable connections between at least some of the global vertical conductors in that column and a subplurality of the global horizontal conductors in the row adjacent to the same logic array block, wherein the horizontal multiplexer means comprises a plurality of logic array block input multiplexers, each having an output connected to the programmable array contained within the logic array block, each logic array block input multiplexer further having inputs connected to the global horizontal connectors in the row adjacent to that logic array block, there being two connections between each global horizontal conductors in the row and the plurality of logic array block input multiplexers in the row, the connections between the logic array block input multiplexers and the global horizontal conductors otherwise being made in a random pattern.

11. A programmable logic device comprising:
a plurality of logic array blocks arranged in a two-dimensional array, each logic array block containing a programmable array and a plurality of macrocells connected to the programmable array;
a plurality of rows each containing a plurality of global horizontal conductors;
a plurality of columns each containing a plurality of global vertical conductors, each row intersecting each column at an intersection, wherein one of the logic array blocks is disposed adjacent to one of the rows and one of the columns at each intersection;
a plurality of horizontal I/O pads;
a plurality of vertical I/O pads;
horizontal I/O means for programmably connecting at least some of the global horizontal conductors in each row to at least one of the horizontal I/O pads;
vertical I/O means for programmably connecting at least some of the global vertical conductors in each column to at least one of the vertical I/O pads;
horizontal multiplexer means connected to each logic array block for programmably connecting the programmable array of a logic array block to at least some of the global horizontal conductors in the row adjacent to the logic array block; and
vertical multiplexer means connected to each logic array block for programmably connecting the macrocells of a logic array block to at least some of the global vertical conductors in the column adjacent to that logic array block, the vertical multiplexer means further providing programmable connections between at least some of the global vertical conductors in that column and a subplurality of the global horizontal conductors in the row adjacent to the same logic array block, wherein the vertical multiplexer means comprises:
a plurality of interconnection demultiplexers, each of which has an input that is connected to a respective macrocell in each logic array block, each interconnection demultiplexer further having outputs that are connected to a mutually exclusive subplurality of the global vertical conductors in the column adjacent to the logic array block, each such connection between the interconnection demultiplexers and the global vertical conductors being mutually exclusive, each interconnection demultiplexer further being programmable so that the macrocell can be electrically connected to any of the global vertical conductors in the mutually exclusive subplurality; and
a plurality of interconnection multiplexers, each of which has an input that is connected to a respective macrocell in each logic array block, each interconnection multiplexer further having inputs that are connected to a mutually exclusive subplurality of the global vertical conductors in the column adjacent to the logic array block, each interconnection multiplexer having an interconnection multiplexer output that is connected to one of the global horizontal conductors in the row adjacent to the logic array block, each interconnection multiplexer further being programmable so that one of the interconnection multiplexer inputs can be connected to the interconnection multiplexer output, wherein within each row, the connections of the interconnection multiplexer outputs to the global horizontal conductors are mutually exclusive.

12. A programmable logic device comprising:
a plurality of logic array blocks arranged in a two-dimensional array, each logic array block containing a programmable array and a plurality of macrocells connected to the programmable array;
a plurality of rows each containing a plurality of global horizontal conductors;

a plurality of columns each containing a plurality of global vertical conductors, each row intersecting each column at an intersection, wherein one of the logic array blocks is disposed adjacent to one of the rows and one of the columns at each intersection;

a plurality of horizontal I/O pads;

a plurality of vertical I/O pads;

horizontal I/O means for programmably connecting at least some of the global horizontal conductors in each row to at least one of the horizontal I/O pads;

vertical I/O means for programmably connecting at least some of the global vertical conductors in each column to at least one of the vertical I/O pads;

horizontal multiplexer means connected to each logic array block for programmably connecting the programmable array of a logic array block to at least some of the global horizontal conductors in the row adjacent to the logic array block; and vertical multiplexer means connected to each logic array block for programmably connecting the macrocells of a logic array block to at least some of the global vertical conductors in the column adjacent to that logic array block, the vertical multiplexer means further providing programmable connections between at least some of the global vertical conductors in that column and a subplurality of the global horizontal conductors in the row adjacent to the same logic array block, wherein the vertical multiplexer means comprises:

a plurality of interconnection demultiplexers, each of which has an input that is connected to a respective macrocell in each logic array block, each interconnection demultiplexer further having outputs that are connected to a mutually exclusive subplurality of the global vertical conductors in the column adjacent to the logic array block, each such connection between the interconnection demultiplexers and the global vertical conductors being mutually exclusive, each interconnection demultiplexer further being programmable so that the macrocell can be electrically connected to any of the global vertical conductors in the mutually exclusive subplurality; and a plurality of interconnection multiplexers, each of which has an input that is connected to a respective macrocell in each logic array block, each interconnection multiplexer further having inputs that are connected to a mutually exclusive subplurality of the global vertical conductors in the column adjacent to the logic array block, each interconnection multiplexer having an interconnection multiplexer output that is connected to one of the global horizontal conductors in the row adjacent to the logic array block, each interconnection multiplexer further being programmable so that one of the interconnection multiplexer inputs can be connected to the interconnection multiplexer output, wherein the vertical multiplexer means further comprises a plurality of tristate buffers each of which has an input connected to a respected macrocell, each tristate buffer having an output that is connected to a global horizontal conductor, and wherein:

for each individual logic block connected to a row, the connections between each of the tristate buffer outputs and the global horizontal conductors are mutually exclusive and are exclusive of the connections made by the interconnection multiplexers to the global horizontal conductors in that row; and within each row, each of the global horizontal conductors which receive signals from said tristate buffers is connected to two such tristate buffers, the connections otherwise being made in a random pattern.

13. A programmable logic device comprising:

a plurality of logic array blocks arranged in a two-dimensional array, each logic array block containing a programmable array and a plurality of macrocells connected to the programmable array;

a plurality of rows each containing a plurality of global horizontal conductors;

a plurality of columns each containing a plurality of global vertical conductors, each row intersecting each column at an intersection, wherein at each intersection one of the logic array blocks is disposed adjacent to one of the rows and one of the columns;

a plurality of horizontal I/O pads;

a plurality of vertical I/O pads;

horizontal I/O means for programmably connecting at least some of the global horizontal conductors in each row to at least one of the horizontal I/O pads;

vertical I/O means for programmably connecting at least some of the global vertical conductors in each column to at least one of the vertical I/O pads;

input means connected to each logic array block for programmably connecting at least some of the global horizontal conductors in each row to logic array blocks adjacent to that row without using any of the global vertical conductors, so that each logic array block receives input signals from the global horizontal conductors in an adjacent row; and first output means connected to each logic array block for programmably connecting the logic array blocks adjacent to each row to at least some of the global horizontal conductors in that row without using any of the global vertical conductors, so that each logic array block provides output signals to the global horizontal conductors in an adjacent row; and second output means connected to each logic array block for connecting the logic array blocks adjacent to each column to at least some of the global vertical conductors in that column without using any of the global horizontal conductors, to that each logic array block provides output signals to the global vertical conductors in an adjacent column, the second output means further providing programmable connections between at least some of the global vertical conductors in the adjacent column and a subplurality of the global horizontal conductors in the adjacent row, wherein the second output means comprises a plurality of interconnection demultiplexers, each of which has an input that is connected to a logic array block and outputs that are connected to a subplurality of the global vertical conductors in the column adjacent to that logic array block, each interconnection demultiplexer being programmable so that the logic array block can be electrically connected to any of the connected global vertical conductors.

14. The programmable logic device defined in claim 13 wherein the second output means further comprises a plurality of interconnection multiplexers, each of which has an input that is connected to a logic array block, each interconnection multiplexer further having inputs that are connected to a mutually exclusive subplurality of the global vertical conductors in the column adjacent to that logic array block, each interconnection multiplexer having an interconnection multiplexer output that is connected to one of the global horizontal conductors in the row adjacent to that logic array block, each interconnection multiplexer further being programmable so that one of the interconnection multiplexer inputs can be electrically connected to the interconnection multiplexer output.

15. A programmable logic device comprising:

a plurality of logic array blocks arranged in a two-dimensional array, each logic array block containing a programmable array and a plurality of macrocells connected to the programmable array;

a plurality of rows each containing a plurality of global horizontal conductors;

a plurality of columns each containing a plurality of global vertical conductors, each row intersecting each column at an intersection, wherein at each intersection one of the logic array blocks is disposed adjacent to one of the rows and one of the columns;

a plurality of horizontal I/O pads;

a plurality of vertical I/O pads;

horizontal I/O means for programmably connecting at least some of the global horizontal conductors in each row to at least one of the horizontal I/O pads;

vertical I/O means for programmably connecting at least some of the global vertical conductors in a column to at least one of the vertical I/O pads;

horizontal multiplexer means connected to each logic array block for programmably connecting the programmable array of a logic array block to at least some of the global horizontal conductors in a row adjacent to that logic array block; and vertical multiplexer means connected to each logic array block for programmably connecting the macrocells of a logic array block to at least some of the global vertical conductors in a column adjacent to that logic array block, the vertical multiplexer means further providing programmable connections between at least some of the global vertical conductors in that column and a subplurality of the global horizontal conductors in an adjacent row, wherein the vertical multiplexer means comprises a plurality of interconnection demultiplexers, each of which has an input that is connected to a respective macrocell in the logic array block that is connected to the vertical multiplexer means, each interconnection demultiplexer further having outputs that are connected to a subplurality of the global vertical conductors in the column adjacent to that logic array block, each interconnection demultiplexer further being programmable so that the macrocell can be electrically connected to any of the connected global vertical conductors, wherein the vertical multiplexer means further comprises a plurality of interconnection multiplexers, each of which has an input that is connected to a respected macrocell in the logic array block that is connected to the global vertical multiplexer means, each interconnection multiplexer further having inputs that are connected to a mutually exclusive subplurality of the global vertical conductors in the column adjacent to that logic array block, each interconnection multiplexer having an interconnection multiplexer output that is connected to one of the global horizontal conductors in the row adjacent to that logic array block, each interconnection multiplexer further being programmable so that one of the interconnection multiplexer inputs can be electrically connected to the interconnection multiplexer output, wherein within each row, the connections of the interconnection multiplexer outputs to the global horizontal conductors are mutually exclusive.

16. The programmable logic device defined in claim 15 wherein within each column, the connections of the interconnection demultiplexer outputs to the global vertical conductors are mutually exclusive.

17. The programmable logic device defined in claim 16 wherein the vertical multiplexer means further comprises a plurality of tristate buffers each of which has an input connected to a respective macrocell in the logic array block that is connected to the vertical multiplexer means, each tristate buffer having an output that is connected to a global horizontal conductor in the row adjacent to the logic array block.

18. The programmable logic device defined in claim 17 wherein:

for each individual logic block adjacent to a row the connections between each of the tristate buffer outputs and the global horizontal conductors are mutually exclusive and are exclusive of the connections made by the interconnection multiplexers to the global horizontal conductors in that row; and within each row, each of the global horizontal conductors which receive signals from said tristate buffers is connected to two such tristate buffers, the connections otherwise being made in a random pattern.

19. The programmable logic device defined in claim 18 wherein the vertical I/O means comprises a plurality of programmable vertical output multiplexers each having an output connected to a respective I/O pad, the inputs of the vertical output multiplexer being connected to the global vertical conductors in the column connected to the vertical I/O means, each of the global vertical conductors having at least two connections to the plurality of vertical output multiplexers in the column the connections between each of the global vertical conductors and the vertical output multiplexers in that column otherwise being made in a random pattern, each of the vertical output multiplexers being programmable to electrically connect one of the connected global vertical conductors to the connected I/O pad.

20. The programmable logic device defined in claim 19 further comprising a plurality of programmable vertical input demultiplexers each having an input connected to a respective I/O pad, the outputs of each vertical input demultiplexer being connected to a mutually exclusive subplurality of the global vertical conductors in the column connected to the vertical I/O means, each of the vertical input demultiplexers being programmable to electrically connect one of the connected global vertical conductors to the connected I/O pad.

21. The programmable logic device defined in claim 20 wherein the horizontal I/O means comprises a plurality of programmable horizontal output multiplexers, each having an output connected to a respective I/O pad, the inputs of the horizontal output multiplexer being connected to the global horizontal conductors in the row connected to the horizontal I/O means, each of the global horizontal conductors having at least two connections to the plurality of horizontal output multiplexers in the row, the connections between each of the global horizontal conductors and the horizontal output multiplexers in the row otherwise being made in a random pattern, each of the horizontal output multiplexers being programmable to electrically connect one of the connected global horizontal conductors to the connected I/O pad.

22. The programmable logic device defined in claim 21 further comprising a plurality of programmable connected to the horizontal I/O means, each of the horizontal input demultiplexers being programmable to electrically connect one of the connected global horizontal conductors to the connected I/O pad.

23. The programmable logic device defined in claim 22 wherein the horizontal multiplexer means comprises a plurality of logic array block input multiplexers, each having an output connected to the programmable array, each logic array block input multiplexer further having inputs connected to the global horizontal conductors in the row adjacent to the logic array block, these being two connections between each global horizontal conductor in the row and the plurality of logic array block input multiplexers in the row, the connections between the logic array block input multiplexers and the global horizontal conductors otherwise being made in a random pattern.

24. The programmable logic device defined in claim 23 wherein the output of each of the macrocells is fed back into the programmable array.

25. The programmable logic device defined in claim 24 wherein the programmable logic array is an AND array.

26. A programmable logic device, comprising:
a plurality of inputs;
a plurality of outputs;
a plurality of logic array blocks arranged in a two-dimensional array of rows and columns;
a programmable logic array contained within each logic array block for providing pterm output signals;
a plurality of macrocells contained within each logic array block that are interconnected with the programmable logic array;
means contained within the macrocells for receiving the pterm output signals and completing a sum of products;
a plurality of registers in each logic array block, each contained within a macrocell and connected to the means for receiving the pterm output signals and completing a sum of products;
a plurality of groups of horizontal conductors, the horizontal conductors in each group being adjacent to a separate one of the rows of logic array blocks;
means for connecting the inputs and outputs to the horizontal and vertical conductors;
input means adjacent to the rows for programmably connecting the horizontal conductors in the group of horizontal conductors adjacent to one of the rows of programmable logic array blocks to each of the programmable logic arrays within the programmable logic array blocks in that row without using any of the global vertical conductors, so that the programmable logic arrays receive input signals from the horizontal conductors;
first output means adjacent to the rows for selectively connecting the logic array blocks in each row to the group of horizontal conductors adjacent to the row without using any of the global vertical conductors, so that the programmable logic array blocks provide output signals to the horizontal conductors;
second output means adjacent to the columns for selectively connecting the logic array blocks in each column to the group of vertical conductors adjacent to the column without using any of the global horizontal conductors, so that the programmable logic array blocks provide output signals to the vertical conductors; and
interconnection means adjacent to substantially each of the logic array blocks for programmably connecting the vertical conductors to the horizontal conductors.

27. The programmable logic device defined in claim 26 wherein the vertical conductors in a column extend continuously without interruption past substantially all of the logic array blocks in that column and the horizontal conductors in a row extend continuously without interruption past substantially all of the logic array blocks in that row.

28. The programmable logic device defined in claim 27 wherein the output means further comprises:
vertical output means for selectively connecting the macrocells of a logic array block to at least some of the vertical conductors in the column adjacent to that logic array block; and
horizontal output means for selectively connecting the macrocells of a logic array block to at least some of the horizontal conductors in the row adjacent to that logic array block.

29. The programmable logic device defined in claim 28 wherein the programmable logic array is an array of electrically erasable programmable read-only memory transistors.

30. The programmable logic device defined in claim 29 wherein the input means are connected to the programmable logic array for providing a plurality of wordline inputs, the macrocells are connected to the programmable logic array for providing a plurality of feedback signals, and the macrocells are connected to the programmable logic array for providing a plurality of expansion signals.

31. The programmable logic device defined in claim 30 wherein the wordline inputs are connected to the gates of the electrically erasable programmable read-only memory transistors in the programmable logic array so that the propagation delay due to passing through the programmable logic array is substantially independent of the number of macrocells to which each wordline input is connected.

32. The programmable logic device defined in claim 26 further comprising:
programmable interconnection links for selectively connecting subsegments of the vertical conductors and for selectively connecting subsegments of the horizontal conductors.

* * * * *

UNITED STATES PATENT AND TRADEMARK OFFICE
CERTIFICATE OF CORRECTION

PATENT NO. : 5,371,422  Page 1 of 2
DATED : December 6, 1994
INVENTOR(S) : Rakesh H. Patel, John E. Turner, Myron W. Wong, and Richard G. Cliff It is certified that error appears in the above-indentified patent and that said Letters Patent is hereby corrected as shown below:

Cover page, Inventors,
    "San Jose, all" should be
        -- San Jose; Richard G. Cliff, Milpitas, all --.

Page 2, OTHER PUBLICATIONS,
    line 3, "(Pittsburgh)." should be
        -- (Pittsburgh)). --;

line 6, "1972, 229" should be -- 1972, pp. 229 --;

line 12, "Horniger" should be -- Horninger --; and line 18, "105" should be -- 101 --.

Column 7, line 40, "E2" should be -- $E^2$ --.

Column 9, line 16, "vertical" should be -- horizontal --.

Column 14, line 49, "to" should be -- so --.

Column 15, line 31, "each" should be -- a --.

Column 16, line 47, "umn the" should be -- umn, the --; and line 49, "that" should be -- the --.

UNITED STATES PATENT AND TRADEMARK OFFICE
CERTIFICATE OF CORRECTION

PATENT NO. : 5,371,422
DATED : December 6, 1994
INVENTOR(S) : Rakesh H. Patel, John E. Turner, Myron W. Wong, and Richard G. Cliff It is certified that error appears in the above-indentified patent and that said Letters Patent is hereby corrected as shown below:

Column 17, line 13 "programmable" should be -- programmable horizontal input demultiplexers, each having an input connected to a respective I/O pad, the outputs of each horizontal input demultiplexer being connected to a mutually exclusive subplurality of the global horizontal conductors in the row --;

line 24, "these" should be -- there --; and line 58, "blocks;" should be
-- blocks;
   a plurality of groups of vertical conductors, the vertical conductors in each group being adjacent to a separate one of the columns of logic array blocks; --.

Signed and Sealed this

Second Day of May, 1995

Attest:

BRUCE LEHMAN

Attesting Officer

Commissioner of Patents and Trademarks